(12) United States Patent
Chatrefou et al.

(10) Patent No.: US 9,766,272 B2
(45) Date of Patent: Sep. 19, 2017

(54) VERY HIGH-VOLTAGE DC LINE VOLTAGE SENSOR

(71) Applicant: Alstom Technology Ltd., Baden (CH)

(72) Inventors: Denis Chatrefou, Bouc Bel Air (FR); Jean-François Mironneau, Lyons (FR); Vincent Troubat, Bourgoin Jallieu (FR)

(73) Assignee: ALSTOM TECHNOLOGY LTD, Baden (CH)

( * ) Notice: Subject to any disclaimer, the term of this patent is extended or adjusted under 35 U.S.C. 154(b) by 301 days.

(21) Appl. No.: 14/442,491

(22) PCT Filed: Nov. 14, 2013

(86) PCT No.: PCT/EP2013/073881
§ 371 (c)(1),
(2) Date: May 13, 2015

(87) PCT Pub. No.: WO2014/076210
PCT Pub. Date: May 22, 2014

(65) Prior Publication Data
US 2016/0274149 A1    Sep. 22, 2016

(30) Foreign Application Priority Data

Nov. 16, 2012 (FR) .................................... 12 60922

(51) Int. Cl.
*G01R 15/06* (2006.01)
(52) U.S. Cl.
CPC ................... *G01R 15/06* (2013.01)
(58) Field of Classification Search
None
See application file for complete search history.

(56) References Cited

U.S. PATENT DOCUMENTS

| | | | | |
|---|---|---|---|---|
| 5,883,508 A | * | 3/1999 | Ermisch ................. | G01R 15/06 323/359 |
| 6,456,094 B2 | * | 9/2002 | Kuperman ............. | G01R 15/06 324/658 |

(Continued)

FOREIGN PATENT DOCUMENTS

| | | | | |
|---|---|---|---|---|
| DE | EP 2853903 A1 | * | 4/2015 | ............. G01R 15/06 |
| EP | 0 980 003 A1 | | 2/2000 | |

(Continued)

OTHER PUBLICATIONS

Search Report issued in French Patent Application No. FR 12 60922 dated Jul. 31, 2013.

(Continued)

*Primary Examiner* — Jermele M Hollington
(74) *Attorney, Agent, or Firm* — Pearne & Gordon, LLP

(57) ABSTRACT

The invention provides a voltage sensor for a very high-voltage direct current line comprising two voltage divider stages connected in series, the sensor being characterized in that a first voltage divider stage (E1) that divides the very high voltage to an intermediate voltage is constituted by at least two elementary voltage divider stages (Em) connected in series and distributed in a composite insulator (I), each elementary stage (Em) comprising a resistor Re in parallel with a capacitor Ce, the second voltage divider stage (E2) that delivers the intermediate voltage being constituted by electronic components comprising capacitors and/or interchangeable resistors.

10 Claims, 2 Drawing Sheets

(56) References Cited

U.S. PATENT DOCUMENTS

| | | | | |
|---|---|---|---|---|
| 8,884,638 B2* | 11/2014 | Karrer | ............... | G01R 27/025 |
| | | | | 324/509 |
| 2005/0122122 A1* | 6/2005 | Yakymyshyn | ......... | G01R 15/06 |
| | | | | 324/705 |
| 2006/0012382 A1* | 1/2006 | Yakymyshyn | ......... | G01R 15/06 |
| | | | | 324/705 |
| 2010/0244865 A1* | 9/2010 | Bjorklund | .............. | G01R 15/04 |
| | | | | 324/706 |
| 2010/0253366 A1* | 10/2010 | Deibele | ................. | G01R 15/06 |
| | | | | 324/649 |
| 2014/0207399 A1* | 7/2014 | Roberson | ............... | G01R 15/18 |
| | | | | 702/62 |
| 2016/0069937 A1* | 3/2016 | Johnson | ................. | G01R 15/16 |
| | | | | 324/126 |
| 2016/0238634 A1* | 8/2016 | Giovanelli | ............. | G01R 15/06 |

FOREIGN PATENT DOCUMENTS

| WO | 99/15906 A1 | 4/1999 |
|---|---|---|
| WO | 2008/148727 A1 | 12/2008 |

OTHER PUBLICATIONS

International Search Report issued in Application No. PCT/EP2013/073881 dated Feb. 6, 2014.
Written Opinion issued in Application No. PCT/EP2013/073881 dated Feb. 6, 2014.

* cited by examiner

VERY HIGH-VOLTAGE DC LINE VOLTAGE SENSOR

TECHNICAL FIELD AND PRIOR ART

The present invention relates to a voltage sensor for a very high-voltage direct current (DC) line.

The field of application of the invention is that of transmitting electrical power over very high-voltage DC power lines. The term "very high voltage DC" refers, for example, to voltages that may reach 1100 kilovolts (kV) DC.

Knowledge of the voltage on a very high-voltage line or between the sets of busbars of electrical substations is necessary in order to perform protection, monitoring, and energy-metering functions. The presently-existing solution for measuring that voltage involves using voltage dividers.

The circuit diagram of a voltage divider is given in FIG. 1.

The voltage divider is constituted by two impedances Z1 and Z2 connected in series and that connect the high-voltage line of potential Va to the ground line of potential Vo. A current $\underline{i}$ flows in the impedances Z1 and Z2. The midpoint between the impedances Z1 and Z2 is at potential Vb. Whence:

$$(Va-Vb)=Z1\times i;$$

and $$(Vb-Vo)=Z2\times i$$

Consequently:

$$(Va-Vo)=(Z1+Z2)\times i,$$

and thus:

$$(Vb-Vo)=(Z2/(Z1+Z2))\times(Va-Vo)$$

The quantity $(Z2/(Z1+Z2))$ is by definition the ratio Rp of the voltage divider. The voltage (Vb−Vo) that is measured by the voltage divider is the image of the voltage (Va−Vo) that is present on the line.

The sensors for measuring very high voltage DC need to be suitable for measuring DC voltages and alternating current (AC) voltages. The AC voltages that are measured correspond to the fluctuations in the DC voltage. By way of example, the frequencies concerned may reach 5 kilohertz (kHz). In preferred manner, the measurement sensors are designed so as to be independent of frequency.

In order to divide voltage independently of frequency, the ratio Rp should be independent of frequency. Each impedance Zi (i=1, 2) is thus constituted by a resistor Ri (i=1, 2) and a capacitor Ci (i=1, 2) connected in parallel, the following condition being made between the elements Ri and Ci:

$$R1\times C1=R2\times C2.$$

Whence:

$$Rp=R2/(R1+R2),$$

or indeed:

$$Rp=C1/(C1+C2).$$

The ratio Rp is thus independent of frequency. It is that type of voltage divider, commonly called a resistor/capacitor voltage divider or RC voltage divider, that is preferably used to measure voltage on very high-voltage lines.

At present, RC dividers are made using capacitive components based on "paper/polypropylene-$SF_6$ gas" insulation techniques, with the $SF_6$ gas under high pressure. Those technologies often lead to internal insulation faults and their applications are often limited to voltages below 800 kV. In addition, the temperature stability of the DC and AC measurements as well as the accuracy of AC harmonic measurements for frequencies up to 5 kHz, are currently insufficient relative to the requirements specified in the majority of specifications.

The invention does not present the above-mentioned drawbacks.

SUMMARY OF THE INVENTION

Indeed, the invention relates to a voltage sensor for very high-voltage direct current line, the sensor consisting of a voltage divider comprising two voltage divider stages connected in series, an intermediate voltage being picked up at the connecting point of the two voltage divider stages, a first voltage divider stage consisting of at least two elementary voltage divider stages connected in series and distributed in a composite insulator, characterized in that an elementary voltage divider stage comprises at least one capacitor and at least one resistor in parallel, the capacitor and the resistor each having a first terminal fastened to a first electrically conductive plate and a second terminal, opposite from the first terminal, fastened to a second electrically conductive plate, the first electrically conductive plate and the second electrically conductive plate each being surrounded by an electrically conductive cap, at least one electrically insulating holder part that clamps the resistor and the capacitor being in contact with the inner wall of the composite insulator so as to fasten the capacitor and the resistor to the inside of the composite insulator.

According to an additional characteristic of the invention, the first electrically conductive plate is a rigid plate of an electrically conductive first mechanical holder part and the second electrically conductive plate is constituted by a flexible metal sheet in the shape of a spider that is secured to a steel rim of a second electrically conductive mechanical holder part, a first electrically conductive plate and a second electrically conductive plate of a single mechanical holder part being connected to each other by electrically conductive spacers.

According to another additional characteristic of the invention, the second voltage divider stage comprises at least one capacitor and at least one resistor in parallel contained within a leaktight box, a shielded cable electrically connecting the second voltage divider stage to the first voltage divider stage.

According to yet another additional characteristic of the invention, an electronic circuit has an input connected to an output of the second voltage divider stage and the electronic circuit comprises circuits for processing the signal that it receives as input.

According to yet another additional characteristic of the invention, the processing circuits include an analog to digital converter.

According to yet another additional characteristic of the invention, the first voltage divider stage is fitted with means for measuring the temperature, which means are suitable for delivering a temperature of the sensor.

According to yet another additional characteristic of the invention, the electronic circuit includes means that are suitable for correcting the temperature drift of the resistances and/or the capacitances of the capacitor of the first and/or of the second voltage divider stage, on the basis of temperature measurements delivered by the temperature measuring means.

According to yet another additional characteristic of the invention, the high voltage may lie in the range 100 kV DC to 1100 kV DC and the intermediate voltage is selected to lie in the range 100 V DC to 200 V DC, by the choice of components constituting the second voltage divider stage.

According to yet another additional characteristic of the invention, the composite insulator is a tube made of epoxy glass fiber which is covered with fins made of silicone.

An advantage of the voltage sensor of the invention is to allow absorbing the variations in dimension of the capacitors and resistors which are due to the fabrication dispersions and/or to the differential expansions of said capacitors and resistors.

BRIEF DESCRIPTION OF THE FIGURES

Other characteristics and advantages of the invention appear on reading the following description of the preferred embodiment of the invention, made with reference to the accompanying figures, in which.

In all of the figures, like references designate like elements.

DETAILED DESCRIPTION OF A PREFERRED IMPLEMENTATION OF THE INVENTION

Figure 2:
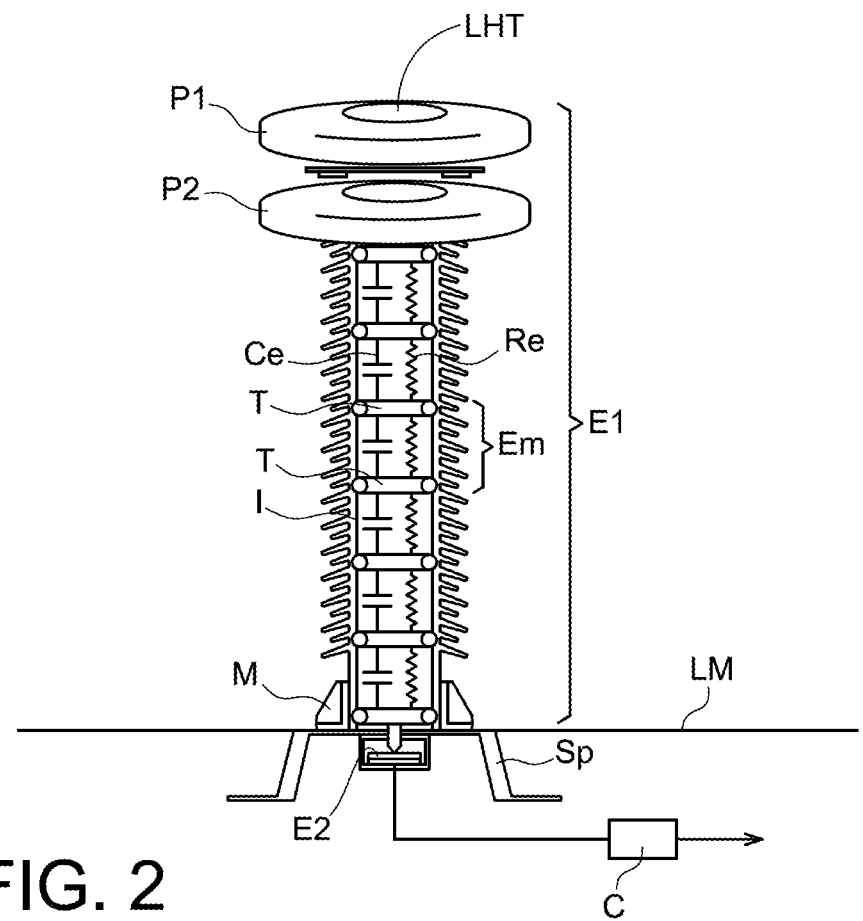
FIG. 2 is a diagram of a voltage sensor in the preferred embodiment of the invention.
Figure 3:
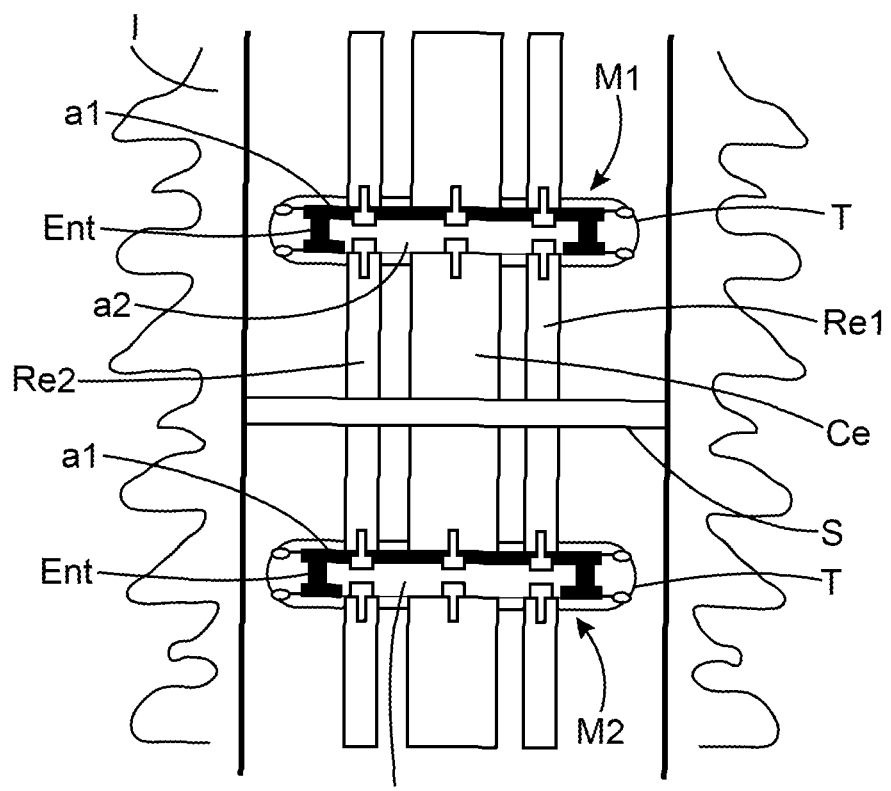
FIG. 3 is a detail view of the voltage sensor shown in FIG. 2.

FIG. 2 is a diagram of the voltage sensor of the preferred embodiment of the invention, and FIG. 3 is a detail view of the voltage sensor shown in FIG. 2.

The voltage sensor comprises two voltage divider stages E1, E2 connected in series. A first terminal of the first divider stage E1 takes the voltage from a very high-voltage line LHT and the second terminal of the first stage E1 is electrically connected to the first terminal of the second stage E2 the second terminal of which is connected to the ground line LM.

One or two electrically-conductive parts P1, P2 are placed at the level where the first terminal of the first stage E1 takes the voltage from the line LHT in such a manner as to protect the connection between the line and the voltage divider from an electrical point of view (elimination of field concentration effects).

The first divider stage E1 comprises a plurality of elementary divider stages Em connected in series, each elementary divider stage comprising a capacitor Ce and a resistor Re connected in parallel and held inside a composite insulator I. The capacitor Ce and the resistor Re are discrete components using standard technology that are suitable for withstanding the required voltage values for the sensor to operate properly (values typically lying in the range 100 kV DC to 1100 kV DC divided by the number N of stages of the divider). By way of non-limiting example, the geometrical dimensions of a capacitor Ce are of the order of thirty centimeters and the maximum rated voltage of said capacitor is of the order of 50 kV DC. The same applies for a resistor Re that has a length of about thirty centimeters and that withstands 50 kV DC. In preferred manner, as shown in FIG. 3, a resistor Re is made by connecting two resistors Re1 and Re2 in parallel.

In the preferred embodiment of the invention shown in FIG. 3, the resistors and the capacitors of two adjacent elementary stages are fastened to a single electrically conductive mechanical holder part Mi(i=1, 2, . . . ), that comprises a thick and rigid electrically conductive plate a1 and a flexible metal sheet a2, e.g. made of steel, in the shape of a spider that is secured to a thick steel rim.

The capacitors and the resistors of a single elementary stage Em are fastened between two electrically conductive mechanical holder parts. Each resistor and each capacitor of an elementary divider stage Em thus has a first terminal fastened, e.g. by screw-fastening, to the plate a1 of a first mechanical holder part M1 and a second terminal fastened, e.g. by screw-fastening, on the flexible metal sheet a2 in the shape of a spider that is secured to a thick steel rim of a second mechanical holder part M2.

Such an assembly advantageously makes it possible to absorb variations in the dimensions of capacitors and resistors linked to manufacturing dispersions and/or to differential expansion. Cohesion between the plate a1 and the plate a2 of a single electrically conductive mechanical holder part is provided by electrically conductive spacers Ent.

An electrically conductive cap T surrounds the plates a1 and a2 of each single mechanical holder part. This cap has the function of properly distributing the electric field lines between the various elementary divider stages. Its shape is advantageously designed to withstand the breakdown voltages. By way of non-limiting example, in the preferred embodiment of the invention, each electrically conductive cap T has a flat metal element that is welded on the inside face of the cap and that presents a series of threaded holes in which screws fasten the cap to the conductive elements a1 and a2.

For each elementary divider stage Em, an electrically insulating holder part S (cf. FIG. 3) clamps the capacitor Ce and the resistors Re1 and Re2 and bears against the inside wall of the composite insulator I. The holder part S makes it possible to center the capacitors and the resistors in the composite insulator with clearance that is sufficient for mounting to be made easy. The composite insulator I contains dry air in an atmosphere having pressure that is preferably greater than $3 \times 10^4$ pascals (Pa) at atmospheric pressure, and that advantageously avoids the sensor being subjected to suction when temperatures become negative.

Advantageously, the mechanical structure constituted by the first stage E1 is a "floating" system that ensures the capacitors and resistors are held mechanically without constraints (thermal expansion; bending of the composite insulator). In addition, the electrical continuity that exists between the top and the bottom of the first stage E1 ensures excellent dielectric strength when the sensor is subjected to rated voltages (presence of rounded caps of shape designed to withstand dielectric voltages).

A shielded cable connects together the first stage and the second stage. The second stage E2 comprises resistors and capacitors having an equivalent layout that is constituted by a capacitor C2 in parallel with a resistor R2. In advantageous manner, it is possible to change the capacitance of one or more capacitors of the second stage E2 so as to adjust the intermediate voltage delivered by the second stage.

The output of the second divider stage is connected to the input of a processor circuit C. The processor circuit C comprises an analog to digital converter that converts the intermediate analog voltage delivered by the second stage into a digital signal.

In an improvement of the invention, means for measuring the temperature that are suitable for delivering a temperature of the sensor are placed in the first stage E1 and the temperature measurement delivered by said measuring means is transmitted to the processing circuit C. The processing circuit C thus comprises means suitable for correcting temperature drift of the resistances and/or of the capacitances of the capacitor of the first and/or of the second voltage divider stage, based on temperature measurements delivered by the temperature measuring means.

Figure 4:
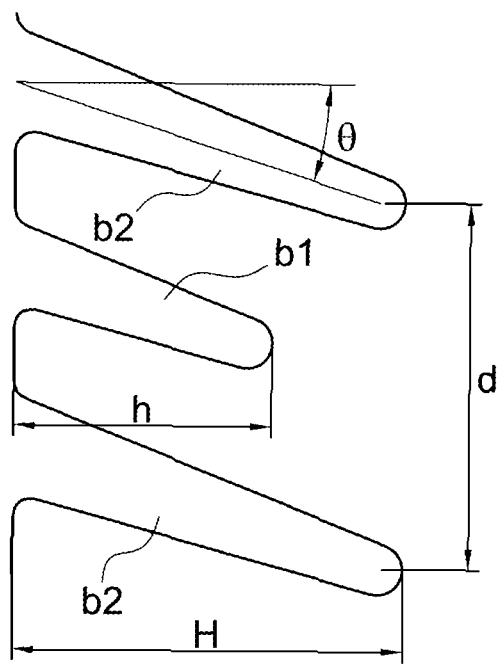
FIG. 4 is a detail view of the composite insulator that participates in making the voltage sensor in the preferred embodiment of the invention.

FIG. 4 is a detail view of the composite insulator that participates in creating the voltage sensor in the preferred embodiment of the invention.

The composite insulator is of the monolithic type, i.e. manufactured as a single part using an epoxy fiber-glass tube covered with fins made of silicone. The silicone fins have a profile capable of reaching the creepage distance specified in the specifications for the voltage sensor. For a voltage sensor that is capable of measuring voltage equal to 800 kV DC, the specified creepage distance is 54.5 millimeters per kilovolt (mm/kV). FIG. 4 shows a profile of fins of the insulator containing the voltage sensor that is capable of measuring voltage of 800 kV DC. From the top to the bottom of the insulator, the fins, directed towards the ground, follow on in such a manner that a small sized fin b1 follows a large sized fin b2. The term "small sized" fin should be understood, for example, as referring to a fin having a distance $\underline{h}$ separating the end of its body from the insulator that is equal to 50 millimeters (mm). In addition, the term "large sized" fin should be understood, for example, as referring to a fin having a distance H separating the end of its body from the insulator that is equal to 70 mm. By way of example, the distance $\underline{d}$ that separates two fins of the same dimensions is equal to 60 mm. The angle θ made by each fin (small or large) with the horizontal is substantially equal to 30°.

By way of non-limiting example, selection of components constituting a voltage sensor of the invention is described below. By way of example, the voltage sensor has the following characteristics:

operating voltage of 800 kV DC;
maximum DC voltage that needs to be withstood for one hour: 1230 kV;
lightning impulse withstand voltage: 2250 kV (voltage wave for which the rise time is 1.2 microseconds (μs) and the fall time is 50 μs);
power frequency (50 Hz) withstand voltage: 1070 kV for AC (with measurement of partial discharge and a top limit of 10 picoloulombs (pC);
accuracy of measurements for DC: 0.1% to 0.2%;
accuracy of measurements for AC: 1% to 3% up to 5 kHz; and
current flowing through the sensor lying in the range 1 milliamps (mA) to 2 mA.

For the design of such a sensor, each elementary stage Em is chosen to withstand a maximum DC voltage of 52 kV with an inter-stage space of about 40 cm. It follows that the number N of elementary stages of the first voltage divider stage is equal to 24 (1230/52) and that the height of the first stage is substantially equal to 9.6 m.

Figure 1:
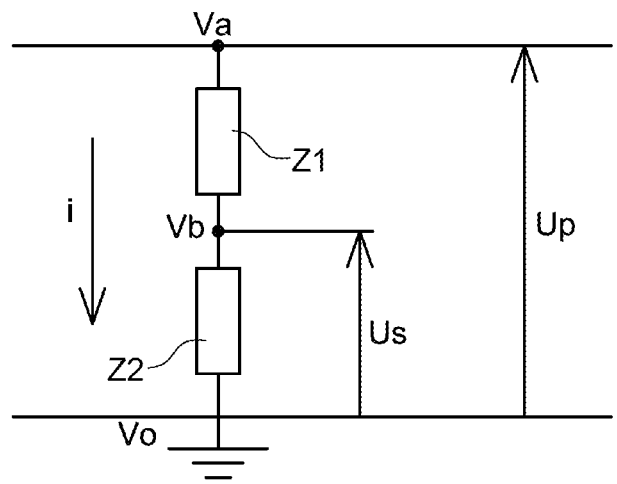
FIG. 1, described above, is a circuit diagram of a voltage divider.

As shown with reference to FIG. 1, a division ratio Rp independent of frequency is written:

$$Rp=R2/(R1+R2); \quad (a)$$

or indeed $$Rp=C1/(C1+C2). \quad (b)$$

When the voltage is solely DC voltage, only the resistors are involved in calculating the ratio (equation (a)) and when the voltage is high-frequency AC voltage, only the capacitors are involved (equation (b)).

The technology used for manufacturing high-voltage resistors uses ceramic bars on which very fine conductive tracks are deposited, which tracks use an alloy, (e.g. a mixture of ruthenium oxide $RuO_2$ and silica) having resistivity that is very stable with temperature. It is therefore relatively easy to make resistors having great thermal stability, typically lying in the range, for example, 10 parts per million per degree Celsius (ppm/° C.) to 20 ppm/° C. In view of the disparity of the drift coefficients of the resistors, it is nonetheless necessary to correct the measurement for large temperature ranges (temperature measurements associated with correction tables as a function of temperature).

In addition, the technology for fabricating the standard capacitors uses insulating films of polypropylene on which silver is plated, thus forming the conductive plates of the electrodes of the capacitor. Double interleaved winding of this type of film thus forms the capacitor. This technology does not make it possible to obtain capacitance of great temperature stability. Temperature measurements are likewise necessary for correcting the measurements.

Selecting the Resistances for the Resistors R1 and Re

The DC voltage measurement must be extremely accurate (0.1% to 0.2%). For this measurement, only the resistive divider is involved. Selection of the resistance for the resistor R1 of the first stage E1 is determined by two contradictory constraints, namely:

that the resistor R1 has a resistance that is low enough not to be disturbed by stray resistances; and
that the resistor R1 has a resistance that is high enough to avoid too much current being diverted into the sensor.

In addition, as mentioned above, the specifications limit the current to a value lying in the range 1 mA to 2 mA.

By way of non-limiting example, for a current value equal to 1.33 mA, the resistance of the resistor R1 is equal to 600 megaohms (MΩ) (R1=800 kV/1.33 mA). Since the first stage is formed of 24 elementary stages, it follows that the resistance of the resistor Re of an elementary stage is equal to 25 MΩ(600 MΩ=24×25 MΩ). In preferred manner, the resistor Re is thus made by means of two 50 MΩ resistors in parallel. That makes it possible to make more uniform the temperature rise due to passing current through the resistors and also provides redundancy. In the event of a fault, e.g. the breaking of a track of a resistor, the divider can continue to operate by means of the other resistor that is able to withstand twice the current; its power rating is determined for this alternative form of operation. Accuracy will then be slightly reduced (resistance ratio changed by 625/600) but is sufficient for continuing to feed measurements to the protection and control systems while guaranteeing the safety of the electrical installation).

Selecting the Capacitances of the capacitors C1 and Ce

Selecting the capacitances of the capacitor Ce is also determined by two contradictory constraints, namely:

having a value that is low enough not to influence the accuracy of the voltage divider at low frequencies; and
having a value that is high enough to avoid being disturbed by the presence of stray capacitances that may appear between the middle portions of the voltage divider and ground or the high-voltage line.

There follows a calculation for determining the capacitance value in compliance with the first criterion only.

There exists a signal frequency for which the impedance of the resistor R1 is equal to the impedance of the capacitor C1. This occurs when the same amount of current flows in the capacitor C1 and in the resistor R1. In the description below, this signal frequency is called the "change-over frequency". It is desirable for the change-over frequency to be far enough away from DC for the resistor R1 to pass more current than the capacitor C1.

At the change-over frequency, as specified above, the following relationship applies:

$R1=1/(C1\times\omega)$ with $\omega=2\pi f_{co}$

Consequently, the change-over frequency $f_{co}$ is written:

$f_{co}=1/(2\pi \times R1 \times C1)$; and the capacitance C1:

$C1=1/(2n\times R1\times f_{co})$

If 1 Hz is selected as the frequency value, for the above-mentioned 600 MΩ resistor R1, this gives:

$C1=300$ picofarads (pF)

Such a capacitance value is slightly too small to be insensitive to stray capacitances. The value selected in the preferred embodiment of the invention is thus slightly greater than the value calculated above, e.g. 500 pF. It has been found that this capacitance value of the capacitor satisfies the desired criteria adequately.

It is thus possible to deduce therefrom the value of the capacitance of an elementary stage capacitor:

$Ce=24\times 500$ pF i.e.:

$Ce=12$ nanofarads (nF)

Selecting the Resistance and the Capacitance for the Resistor R2 and the Capacitor C2

It is the capacitance and the resistance of the capacitor C2 and of the resistor R2 that determine the intermediate output voltage. As mentioned above, the selected value of the voltage output for the preferred embodiment of the invention is equal to 200 volts (V). Such a voltage value makes it possible to select a capacitance for the capacitor C2 that is large enough for the capacitance of the connection cable between the first and the second stages to be negligible (by way of example, the line capacitance of the connection cable lies in the range 10 picofarads per meter (pF/m) to 100 pF/m).

In order to calculate the resistance and capacitance of R2 and C2, the output voltage of the voltage divider is determined, e.g. equal to 200 V. The voltage divider ratio Rp is then determined and its value is:

$Rp=200$ V/800000 V i.e.:

$Rp=1/4000$

In addition, in view of the equations associating the components of the voltage divider and the division ratio:

$Rp=R2/(R1+R2)$, and also $Rp=C1/(C1+C2)$

It can thus be deduced that:

$R2=R1/(4000-1)$ $C2=(4000-1)\times C1$ whence:

$R2\approx 150$ kiloohms (kΩ) and $C2\approx 2000$ nF

An essential advantage of the voltage sensor of the invention is that it enables the voltage ratio to be adjusted very accurately. The capacitance of the capacitor C2 is modified by adding or removing capacitors connected in parallel, for this purpose, on the circuit C. By way of example, mathematical simulations are used to determine which capacitors are selected. The intermediate voltage is thus adjusted, by a wide-band resistive divider, to a value (e.g. +/−10 V) that is compatible with the analog to digital converters. For this purpose, the electronic circuit C includes an analog to digital converter that converts the intermediate voltage into a digital signal that is transmitted by a digital transmission system via optical fiber.

Digitizing the signal thus takes place advantageously in the circuit C that is situated at the foot of the sensor, and the measurement data can then advantageously be transported over a long distance, from the circuit C, by digital transmission, and via optical fiber.

Digitizing the signal conserves the pass-band characteristics of the signal in full. By way of non-limiting example, the signal is sampled at 200 kHz after being filtered by an anti-aliasing low-pass analog filter that guarantees accuracy and frequency stability. The signal is then decimated at 42 kHz then transported via a digital optical channel, e.g. at 100 megabits per second (Mbit/s).

In addition to the above-mentioned advantages, other advantages of the voltage sensor of the invention may be mentioned, namely:

increased safety of the sensor due to a very low probability of explosion;

respect for environmental conditions (no oil, no $SF_6$ gas, but rather insulation using dry air at atmospheric pressure);

simplification of the cabling of the secondary stage;

maintenance that is made easier by intelligent man-machine interface software; and the possibility of withstanding a breakdown on a measuring channel without interrupting service, by means of electronic redundancies, thus avoiding untimely interruptions of the sub-station, which are generally very costly.

What is claimed is:

1. A voltage sensor for a very high-voltage direct current line, the sensor consisting of a voltage divider comprising two voltage divider stages connected in series, an intermediate voltage being picked up at the connecting point of the two voltage divider stages, a first voltage divider stage (E1) consisting of at least two elementary voltage divider stages (Em) connected in series and distributed in a composite insulator, characterized in that an elementary voltage divider stage (Em) comprises at least one capacitor (Ce) and at least one resistor (Re) in parallel, the capacitor and the resistor each having a first terminal fastened to a first electrically conductive plate (a1) and a second terminal, opposite from the first terminal, fastened to a second electrically conductive plate (a2), the first electrically conductive plate (a1) and the second electrically conductive plate (a2) each being surrounded by an electrically conductive cap (T), at least one electrically insulating holder part (S) that clamps the resistor and the capacitor being in contact with the inner wall of the composite insulator (I) so as to fasten the capacitor and the resistor to the inside of the composite insulator.

2. A voltage sensor for a very high-voltage direct current line according to claim 1, wherein the first electrically conductive plate (a1) is a rigid plate of an electrically conductive first mechanical holder part and the second electrically conductive plate (a2) is constituted by a flexible metal sheet in the shape of a spider that is secured to a steel rim of a second electrically conductive mechanical holder part, a first electrically conductive plate (a1) and a second electrically conductive plate (a2) of a single mechanical holder part being connected to each other by electrically conductive spacers (Ent).

3. A voltage sensor according to claim 1, wherein the second voltage divider stage (E2) is made of electronic components comprising capacitors and/or resistors which are interchangeable.

4. A voltage sensor according to claim 3, wherein the second voltage divider stage (E2) comprises at least one capacitor and at least one resistor in parallel contained within a leak tight box, a shielded cable electrically connecting the second voltage divider stage to the first voltage divider stage.

5. A voltage sensor for a very high-voltage direct current line according to claim 1, wherein an electronic circuit (C) has an input connected to an output of the second voltage divider stage and the electronic circuit (C) comprises circuits for processing the signal that it receives as input.

6. A voltage sensor for a very high-voltage direct current line according to claim 5, wherein the processing circuits include an analog to digital converter.

7. A voltage sensor for a very high-voltage direct current line according to claim 1, wherein the first voltage divider stage is fitted with means for measuring the temperature, which means are suitable for delivering a temperature of the sensor.

8. A voltage sensor for a very high-voltage direct current line according to claim 5, wherein the first voltage divider stage is fitted with means for measuring the temperature, which means are suitable for delivering a temperature of the sensor, and wherein the electronic circuit (C) includes means that are suitable for correcting the temperature drift of the resistances and/or the capacitances of the capacitor of the first and/or of the second voltage divider stage, on the basis of temperature measurements delivered by the temperature measuring means.

9. A voltage sensor for a very high-voltage direct current line according to claim 1, wherein the very high voltage lies in the range 100 kV DC to 1100 kV DC and the intermediate voltage lies in the range 100 V DC to 200 V DC.

10. A voltage sensor for a very high-voltage direct current line according to claim 1, wherein the composite insulator (I) is a tube made of epoxy fiber glass covered with fins made of silicone (b1, b2).

* * * * *